United States Patent [19]

Faure et al.

[11] Patent Number: 5,367,254

[45] Date of Patent: Nov. 22, 1994

[54] TEST PROBE ASSEMBLY USING BUCKLING WIRE PROBES WITHIN TUBES HAVING OPPOSED OVERLAPPING SLOTS

[75] Inventors: Louis H. Faure, Poughkeepsie; Terence W. Spoor, Marlboro, both of N.Y.

[73] Assignee: International Business Machines Corporation, Armonk, N.Y.

[21] Appl. No.: 11,556

[22] Filed: Feb. 1, 1993

[51] Int. Cl.[5] ............................................. G01R 31/02
[52] U.S. Cl. ..................................... 324/761; 324/754
[58] Field of Search ............... 324/158 F, 158 P, 72.5; 439/482, 591, 581, 91

[56] References Cited

U.S. PATENT DOCUMENTS

| | | | |
|---|---|---|---|
| 3,806,801 | 4/1974 | Bove | 324/72.5 |
| 4,423,376 | 12/1983 | Byrnes et al. | 324/158 P |
| 4,505,529 | 3/1985 | Barkus | 339/17 M |
| 4,506,215 | 3/1985 | Coughlin | 324/158 P |
| 4,622,514 | 11/1986 | Lewis | 324/158 P |
| 4,686,464 | 8/1987 | Elsässer et al. | 324/158 P |
| 4,764,722 | 8/1988 | Coughlin et al. | 324/158 P |
| 4,816,754 | 3/1989 | Buechele et al. | 324/158 F |
| 4,843,315 | 6/1989 | Bayer et al. | 324/158 P |
| 4,931,726 | 6/1990 | Kasukabe et al. | 324/158 P |
| 5,192,213 | 3/1993 | Kosugi et al. | 439/591 |

FOREIGN PATENT DOCUMENTS 0514457  6/1976  U.S.S.R. .......................... 324/158 P

OTHER PUBLICATIONS

Faure, L. H. "Test Probe", IBM Technical Disclosure Bulletin, vol. 18, No. 8, Jan. 1976, pp. 2527–2528.

Auerbach, I. et al. "Trilead Connector Assembly Tool", IBM Technical Disclosure Bulletin, vol. 23, No. 6, Nov. 1980, pp. 2379–2381.

Lipschutz, L. D. et al. "Buckling Wire Probe Assembly", IBM Technical Disclosure Bulletin, vol. 15, No. 10, Mar. 1973, pp. 3032–3034.

Buyck, W. J. "Twin-Lead Contact Probe", IBM Technical Disclosure Bulletin, vol. 14, No. 2, Jul. 1971, p. 558.

*Primary Examiner*—Vinh Nguyen
*Attorney, Agent, or Firm*—Michael J. Balconi-Lamica

[57] ABSTRACT

A test probe assembly is disclosed having bucking beam displacement test probe units which are easily replaceable. Each test probe unit includes a wire and a slotted tube containing the wire, one end of the wire being attached to one end of the tube and the other end of the wire protruding from the other end of the tube. The wire slidably engages an inner diameter of the tube. Each tube is slotted at a plurality of locations along the longitudinal axis thereof to provide spaces for the buckling beam displacement of the respective wire when the protruding end of the wire is brought to bear against a device point to be tested. The slots are staggered so that adjacent ones are disposed radially opposite to each other with some overlap along the longitudinal axis of the tube. The test probe units are inserted in predetermined respective holes of an apertured block of insulating material in accordance with a pattern of device points to be tested.

4 Claims, 1 Drawing Sheet

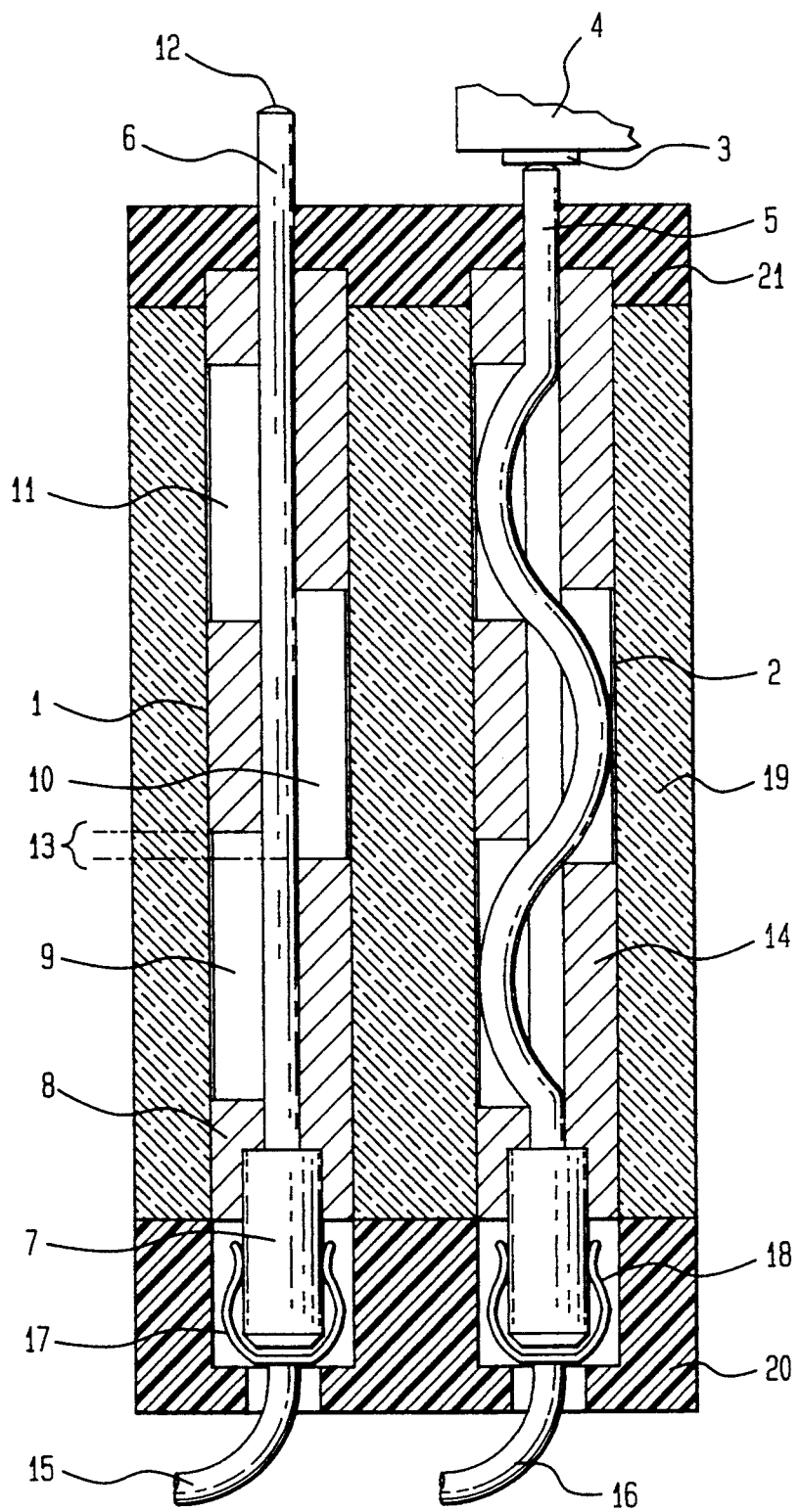

TEST PROBE ASSEMBLY USING BUCKLING WIRE PROBES WITHIN TUBES HAVING OPPOSED OVERLAPPING SLOTS

BACKGROUND OF THE INVENTION

The invention generally relates to a probe assembly for contacting test points on semiconductor device chips and, more particularly, to a modular probe assembly easily adaptable to various high density test point patterns.

Multiple buckling beam probe assemblies are well known in the art for contacting test points on very small scale electrical structures, such as semiconductor device chips. In varying degrees, techniques have been proposed for contacting closely spaced points on irregularly elevated surfaces by means of probe wires which are caused to deflect or buckle as pressure is applied to the probe assembly. For example, U.S. Pat. No. 4,622,514 for Multiple Mode Buckling Beam Probe Assembly, issued to Stephan P. Lewis on Nov. 11, 1986, discloses a multiple probe assembly wherein each probe is guided by a series of spaced parallel plates. Even numbered plates are apertured by small holes which slidably engage respective probe wires. Odd numbered plates are apertured by large holes which permit buckling beam deflection of the probe wires when the probes are brought to bear against a device under test. All plates are held together at their ends to form a unit. Thus, the probes are not completely contained and supported over their entire lengths but only at intervals at the locations of the spaced plates. No special provision is made for the rapid replacement of individual probes for customizing the pattern of probes to meet the differing test point pattern needs of differing devices to be tested.

The containment and support over the length of the individual probes are provided to some extent in the single-slotted tube designs shown in IBM ® Technical Disclosure Bulletin "Trilead Connector Assembly Tool" by I. A. Auerbach and R. Bove, Vol. 23, No. 6, November 1980, pp. 2379, and in U.S.S.R. Patent SU-514-457 issued in the name of E. E. Onegin on Feb. 4, 1974. In both cases, each probe wire is placed within a singly slotted tube. When the tip of the probe wire is pressed against a respective test point, the wire is caused to buckle and penetrate through the slot in the tube. An unslotted outer tube limits the maximum buckling in the case of the cited Technical Disclosure Bulletin. No restricting structure is illustrated in the cited U.S.S.R. patent to limit maximum buckling.

U.S. Pat. No. 4,843,315 for Contact Probe Arrangement for Electrically Connecting a Test System to the Contact Pads of a Device to be Tested, issued to Thomas Bayer, et al., on Jun. 27, 1989, describes a multiplicity of contiguous apertured plates for guiding the probe wires over a greater fraction of their length. Each plate is apertured by large holes which permit buckling beam deflection of the probe wires when they are pushed against a device under test. Even numbered plates are fixed so that all holes are in vertical alignment. Odd numbered plates are similarly fixed, but the aligned holes of the odd plates are offset relative to the aligned holes of the even set so that each probe wire contacts the opposed walls of contiguous holes when no devices are being tested. For ease of insertion of the probe wires into respective apertures, the plates are readjusted so that all of the holes are in vertical alignment. After the wires have been inserted, the even and odd plates are realigned into the hole relationship first described. Consequently, the ease of customizing the pattern of probes to meet differing test point pattern requirements is somewhat impacted.

SUMMARY OF THE INVENTION

One object of the present invention is to provide an assembly of test probes characterized by complete containment and support of each probe over substantially its entire length while allowing for ease of customization of probe pattern.

Another object is to provide an assembly of test probes in a high density, closely spaced configuration which may be easily modified to meet the needs of the differing test point patterns of the devices to be tested.

A further object is to provide an assembly of test probes characterized by complete containment and support of each probe over substantially its entire length by means of a respective probe container forming an integral replaceable unit with its probe.

These and other objects of the invention are achieved in a preferred embodiment by the provision of an array-apertured block of electrical insulating material for receiving a multiplicity of test probe units in predetermined ones of the array apertures. Each probe unit extends at one end beyond the aforesaid block through a removable end cap which secures the units to the block.

Each test probe unit comprises a tube having an inner diameter for slidably receiving a probe wire. The probe wire is fixed at one end to the tube but is otherwise free to move relative thereto as will be described. The second end of the probe wire extends beyond the tube. The tube is slotted at intervals along its length to provide spaces for the buckling beam displacement of the probe wire when the second end thereof is brought to bear against a device being tested. The slots are staggered so that adjacent ones are disposed radially opposite to each other with a small amount of longitudinal overlap.

BRIEF DESCRIPTION OF THE DRAWINGS

The sole figure is a cross-sectional view of a repetitive portion of a test probe assembly constructed in accordance with the present invention.

BEST MODE FOR CARRYING OUT THE INVENTION

A fragmented portion of a test probe assembly, in accordance with the invention, is shown in the sole figure comprising test probe units 1 and 2. Unit 1 is non-actuated. Unit 2 is actuated, i.e., it is in pressure contact with test point 3 of device 4 under test. Probe wire 5 of unit 2 is undergoing buckling beam displacement due to the pressure exerted by point 3 upon the facing tip of wire 5.

Referring more particularly to non-actuated unit 1, probe wire 6 is fixed at one end via enlarged portion 7 to tube 8. Tube 8 is slotted (9, 10, 11) at intervals along its length to provide spaces for the buckling beam displacement of probe wire 6 when tip 12 thereof is pressed against a device (not shown) being tested. The slots are staggered longitudinally along tube 8 so that adjacent ones (e.g., 9 and 10) are disposed radially opposite to each other with a small amount (13) of longitudinal overlap. The overlap provides room for probe wire 6 to enter slots 9 and 10, when undergoing buckling (as shown with wire 2), without unduly stressing the points of flexure along wire 6. Tubes 8 and 14 may consist of either conductive or non-conductive material. Probe wires 5 and 6 are electrically conductive and are connected to energizing wires 15 and 16 via conducting spring clips 17 and 18 imbedded in the end portion 20 of insulating test probe assembly block 19. Wires 15 and 16 extend to a suitable test equipment (not shown) in a conventional manner.

Block 19 is array-apertured to receive test probe units similar to units 1 and 2 at predetermined locations determined by the needs of the differing test point patterns of the devices to be tested. Test probe units are inserted where needed or removed where not needed to adapt the test probe assembly to various devices under test by removing end portion 21 of insulating block 19. It should be noted that end portion 21 is apertured to allow only the probe wires of the individual test probe units to pass through. The shoulder thus formed about the holes in end portion 21 engages the ends of the tube portions of the respective test probe units whereby said units are held securely in place when end portion 21 is fastened to block 19 by suitable means (not shown).

It should be observed that the probe wires are completely contained and supported over their entire lengths and are always electrically insulated from each other even when subjected to buckling by block 19 whereby close spacing and high density of the test probe units are achieved. Compensation for variations in test point heights on the devices under test is readily achieved by providing a sufficient number of slots in the tubes of the test probe units. The integral construction of the probe wire and tube makes for high contact integrity and reliability for device testing.

While the invention has been particularly shown and described with reference to the preferred and alternate embodiments thereof, it will be understood by those skilled in the art that various changes in form and detail may be made therein without departing from the spirit and scope of the invention.

What is claimed is:

1. An integral test probe unit comprising:
    a conductive wire having a first end and a second end, said wire undergoing buckling beam displacement when subjected to axially opposing forces; and
    a tube,
    said tube having an inner diameter for slidably receiving said wire, the first end of said wire extending beyond said tube and the second end of said wire being fixed to said tube,
    said tube further having slots, said slots being at a plurality of locations along the longitudinal axis thereof to provide spaces for the buckling beam displacement of said wire when pressure is applied axially to said first end of said wire relative to said tube,
    said slots further being staggered so that adjacent ones are disposed radially opposite to each other with an amount of overlap along the longitudinal axis of said tube.

2. A test probe assembly comprising:
    a multiplicity of integral test probe units, wherein each integral test probe unit comprises a conductive wire and a tube, said wire having a first end and a second end, said wire undergoing buckling beam displacement when subjected to axially opposing forces, said tube having an inner diameter for slidably receiving said wire, the first end of said wire extending beyond said tube and the second end of said wire being fixed to said tube, said tube further having slots, said slots being at a plurality of locations along the longitudinal axis thereof to provide spaces for the buckling beam displacement of said wire when pressure is applied axially to said first end of said wire relative to said tube, said slots further being staggered so that adjacent ones are disposed radially opposite to each other with an amount of overlap along the longitudinal axis of said tube; and
    an electrical insulating block, said block having a removable end portion and being apertured to receive said multiplicity of integral test probe units, said units being inserted in the apertures of said block so that respective first ends of respective wires of said units extend beyond said block through said removable end portion thereof,
    said removable end portion of said block being apertured to allow only respective wires of said units to pass through but not respective tubes of said units.

3. The apparatus defined in claim 2, wherein said block is further array-apertured according to a first predetermined pattern and said units are inserted in said apertures in accordance with a second predetermined pattern.

4. The apparatus defined in claim 2, further comprising respective means in said block for removably electrically engaging respective second ends of respective wires of said units.

* * * * *